US009069365B2

(12) United States Patent
Brown et al.

(10) Patent No.: US 9,069,365 B2
(45) Date of Patent: *Jun. 30, 2015

(54) DC-DC CONVERTER ENABLING RAPID OUTPUT VOLTAGE CHANGES

(71) Applicant: R2 Semiconductor, Inc., Sunnyvale, CA (US)

(72) Inventors: James E.C. Brown, San Jose, CA (US); Daniel Dobkin, Sunnyvale, CA (US); Pablo Moreno Galbis, Palo Alto, CA (US); Cory Severson, Coarsegold, CA (US); David Fisher, Menlo Park, CA (US)

(73) Assignee: R2 Semiconductor, Inc., Sunnyvale, CA (US)

( * ) Notice: Subject to any disclaimer, the term of this patent is extended or adjusted under 35 U.S.C. 154(b) by 225 days.

This patent is subject to a terminal disclaimer.

(21) Appl. No.: 13/874,631

(22) Filed: May 1, 2013

(65) Prior Publication Data
US 2013/0249505 A1 Sep. 26, 2013

Related U.S. Application Data

(63) Continuation-in-part of application No. 13/400,048, filed on Feb. 18, 2012, now Pat. No. 8,725,218.

(51) Int. Cl.
G05F 1/00 (2006.01)
G05F 3/08 (2006.01)
(Continued)

(52) U.S. Cl.
CPC ............... *G05F 3/08* (2013.01); *H02M 3/156* (2013.01); *H02M 3/158* (2013.01); *H02M 2001/0032* (2013.01); *Y02B 70/16* (2013.01);
(Continued)

(58) Field of Classification Search
CPC ..... H02M 3/156; H02M 3/157; H02M 3/158; G05F 3/08
USPC .......................................... 323/271, 282–288
See application file for complete search history.

(56) References Cited

U.S. PATENT DOCUMENTS 4,479,174 A 10/1984 Cates
4,541,041 A 9/1985 Park et al.
(Continued)

OTHER PUBLICATIONS

Notification of Transmittal of the International Search Report and the Written Opinion of the International Searching Authority, PCT/US14/32421, Dated Oct. 1, 2014.
(Continued)

*Primary Examiner* — Jue Zhang
(74) *Attorney, Agent, or Firm* — Brian R. Short

(57) ABSTRACT

Embodiments for methods, apparatus and systems for operating a voltage regulator are disclosed. One embodiment of the voltage regulator generates a switching voltage through controlled closing and opening of a series switch element and a shunt switch element. The voltage regulator further includes a switched output filter that includes a plurality of capacitors for filtering the switching voltage and generating an output voltage. A mode controller is operative to disconnect at least one of the plurality of capacitors upon receiving a first indicator, where disconnecting causes the at least one of the plurality of capacitors to electrically float, wherein while the at least one capacitor is disconnected the output voltage is changed from a first value to a second value, return the output voltage to a first value or a third value upon receiving a second indicator, and reconnect the at least one of the plurality of capacitors.

15 Claims, 10 Drawing Sheets

(51) Int. Cl.
  *H02M 3/156* (2006.01)
  *H02M 3/158* (2006.01)
  *H02M 1/00* (2007.01)
  *H04B 1/04* (2006.01)
  *H04B 1/16* (2006.01)
  *H04B 1/403* (2015.01)
  *H03H 7/01* (2006.01)
  *H03H 7/06* (2006.01)
  *H02M 1/14* (2006.01)

(52) U.S. Cl.
  CPC ............ *H04B 1/04* (2013.01); *H04B 1/0475* (2013.01); *H04B 1/1607* (2013.01); *H04B 1/406* (2013.01); *H03H 7/0153* (2013.01); *H03H 7/06* (2013.01); *H03H 2210/025* (2013.01); *H03H 2210/036* (2013.01); *H02M 1/14* (2013.01)

(56) References Cited

U.S. PATENT DOCUMENTS

| | | | |
|---|---|---|---|
| 4,634,956 A | 1/1987 | Davis et al. | |
| 4,884,183 A | 11/1989 | Sable | |
| 5,028,861 A | 7/1991 | Pace et al. | |
| 5,170,333 A | 12/1992 | Niwayama | |
| 5,481,178 A | 1/1996 | Wilcox et al. | |
| 5,994,885 A | 11/1999 | Wilcox et al. | |
| 6,304,066 B1 | 10/2001 | Wilcox et al. | |
| 6,433,525 B2 | 8/2002 | Muratov et al. | |
| 6,580,258 B2 | 6/2003 | Wilcox et al. | |
| 6,608,536 B2 * | 8/2003 | Fallahi | 333/168 |
| 6,937,094 B2 | 8/2005 | Khanifar et al. | |
| 7,043,213 B2 | 5/2006 | Robinson et al. | |
| 7,132,891 B1 | 11/2006 | Dening et al. | |
| 7,382,178 B2 | 6/2008 | Caplan et al. | |
| 7,400,865 B2 | 7/2008 | Järvinen | |
| 7,454,238 B2 | 11/2008 | Vinayak et al. | |
| 7,466,195 B2 | 12/2008 | Drogi et al. | |
| 7,482,869 B2 | 1/2009 | Wilson | |
| 7,570,931 B2 | 8/2009 | McCallister et al. | |
| 7,659,700 B2 | 2/2010 | Holveck et al. | |
| 7,907,920 B2 | 3/2011 | Chan et al. | |
| 8,044,705 B2 | 10/2011 | Nandi et al. | |
| 8,330,532 B2 | 12/2012 | Nikolov et al. | |
| 8,725,218 B2 * | 5/2014 | Brown et al. | 323/284 |
| 8,843,180 B2 * | 9/2014 | Brown et al. | 323/274 |
| 2003/0090339 A1 * | 5/2003 | Yu et al. | 333/167 |
| 2004/0174152 A1 | 9/2004 | Hwang et al. | |
| 2006/0178119 A1 * | 8/2006 | Jarvinen | 455/114.2 |
| 2010/0233977 A1 | 9/2010 | Minnis et al. | |
| 2012/0244916 A1 | 9/2012 | Brown et al. | |
| 2013/0249505 A1 | 9/2013 | Brown et al. | |

OTHER PUBLICATIONS

Anderson et. al. "High-Efficiency High-Level Modulator for Use in Dynamic Envelope Tracking CDMA RF Power Amplifiers" 2001 IEEE MTT International Microwave Symposium p. 1509.

Cidronali et. al. "A 1-bit Dynamically Biased Power Amplifier for Step Envelope Tracking Transmitters" Proc 39th European Microwave Conference p. 334 (2009).

Hanington et al., "High-Efficiency Power Amplifier Using Dynamic Power-Supply Voltage for CDMA Applications", IEE Trans. Microwave Theory and Techniques, v 47, p. 1471 (1999).

Hoyerby et. al. "Envelope Tracking Power Supply with fully controlled 4th order Output Filter" APEC 2006 p. 993.

Huang et. al. "Dithering Skip Modulator with a Novel Load Sensor for Ultra-wide-load High-Efficiency DC-DC Converters" ISLPED 2006.

Kapat et. al., "Modeling and Analysis of DC-DC Converters Under Pulse Skipping Modulation",Santanu Kapat, Soumitro Banerjee, Senior Member, IEEE, and Amit Patra, Member, IEEE Department of Electrical Engineering, Indian Institute of Technology, Kharagpur—721302, India.

Khanifar et. al. "Enhancement of Power Amplifier Efficiency Through Dynamic Bias Switching" 2004 IEEE MTT International Microwave Symposium p. 2047.

Lopez et. al. "Design of Highly Efficient Wideband RF Polar Transmitters Using the Envelope-Tracking Technique" IEEE J. Solid-State Circuits v. 44 p. 2276 (2009).

Sahu et. al. "A High-Efficiency Linear RF Power Amplifier with a Power-Tracking Dynamically Adaptive Buck-Boost Supply" IEEE Trans Microwave Theory and Techniques v 52 #1, p. 112 (2004).

Staudinger et. al. "High Efficiency CDMA RF Power Amplifier Using Dynamic Envelope Tracking Technique" 2001 IEEE MTT International Microwave Symposium.

Suguhara et. al. "Low Power Consumption and High Power Density Integrated DC-DC Converter for Portable Equipments" IEEE Asian Solid-State Circuits Cofnerence 2008 paper 5-2.

Takahashi et. al. "An Envelope Tracking Power Amplifier using an Adaptive Biased Envelope Amplifier for WCDMA Handsets" 2008 Radio Frequency Integrated Circuit Conference, p. 405.

Wang et. al. "A Monolithic High-Efficiency 2.4-GHz 20-dBm SiGe BiCMOS Envelope-Tracking OFDM Power Amplifier" IEEE J. Solid-State Ckts v 42 #6 p. 1271 (2007).

Warembourg "A DC/DC Converter for ISDN Terminals" INTELEC 1987 p. 76.

Rodriguez et. al. "Multilevel converter for Envelope Tracking in RF power amplifiers" M. Rodriguez, P. Miaja, A. Rodriguez and J. Sebastian ECCE 2009. p. 503.

Senanayake et. al. "Fast-Response Load Regulation of DC-DC Converter by Means of Reactance Switching" Power Electronics Specialist Conference 2003 p. 1157.

\* cited by examiner

Generating, by a switching controller, a switching voltage through controlled closing and opening of a series switch element and a shunt switch element

610

Generating, by a switchable output filter, a regulated output voltage by filtering the switching voltage, wherein the switchable output filter comprises a plurality of capacitors that are selectively included within the switchable output filter

DC-DC CONVERTER ENABLING RAPID OUTPUT VOLTAGE CHANGES

RELATED APPLICATIONS

The patent application is a continuation-in-part (CIP) of U.S. patent application Ser. No. 13/400,048, filed on Feb. 18, 2012, which claims priority to U.S. Provisional Patent Application Ser. No. 61/467,900, filed Mar. 25, 2011 which are herein incorporated.

FIELD OF THE DESCRIBED EMBODIMENTS

The described embodiments relate generally to power conversion. More particularly, the described embodiments relate to systems, methods and apparatus for a voltage regulator that is operable in multiple modes.

BACKGROUND

Switched-mode power converters are widely used to convert between differing DC voltages. A typical example of a buck converter (used to provide a reduced voltage from a higher-voltage supply) is shown in FIG. 1.

Transistor switches are used to alternately connect an inductor to a supply voltage and ground, at a switching frequency $f_{sw}$. The output of the inductor is connected to a load.

In some applications, the target output voltage of a given converter is fixed during its useful life. In other applications, the target output voltage may be changed. For example, in the case where a DC-DC converter is employed to provide power for the output amplifier of a wireless transmitter, it is well-known that improved overall system efficiency can be obtained if the converter output voltage is varied depending on the radio frequency power to be transmitted. The benefits of this procedure vary widely depending on the nature of the wireless signal to be transmitted. For example, signals used in cellular communications based on code-division multiple access (CDMA) use intentional control of average transmit power at each mobile station to ensure roughly equal received power at the basestation. In order to ensure this result, the transmitted power in a mobile station (a phone, handheld device, or data modem) is adjusted periodically. In many standards, this adjustment takes place at the beginning of a transmission "slot", a fixed time period in which a fixed number of symbols are sent. For example, in WCDMA continuous transmission, average transmit power is changed at the beginning of each 667-microsecond slot. In order to optimize overall system efficiency, the supply voltage delivered to the transmit power amplifier may be similarly adjusted at the beginning of each slot. This adjustment may be accomplished using a linear regulator, but better system efficiency can be obtained with a switched-mode converter.

In modern wireless standards in which multiple streams of data are simultaneously sent using either code-division or orthogonal frequency division multiplexing (OFDM), the instantaneous amplitude of the transmitted signal varies considerably from one symbol to the next. Further efficiency improvements can be obtained if the supply voltage is similarly adjusted on a symbol-by-symbol basis; this mode of operation is known as Envelope Tracking Envelope Tracking requires very rapid adjustments in the power amplifier supply voltage; in the WCDMA standard, the symbol duration is (1/3.84) microseconds, and the envelope of each symbol may vary in an uncorrelated, pseudo-random fashion when multiple coded streams are simultaneously transmitted. Undue delay or tracking errors in the supply may lead to distorted symbols, resulting in spurious output frequencies, and increases in the Error Vector Magnitude (EVM) of the transmitted signal. Envelope Tracking of such high-speed signals has usually been performed using linear regulators, or a linear regulator in combination with a switched-mode converter, because low-switching-frequency converters cannot provide the rapid response required for Envelope Tracking applications.

In the case where a power-controlled mobile station is reasonably close to a basestation, very small transmit power may be sufficient to provide low bit error rates while minimizing interference. For example, it is known that when voice is being transmitted, a CDMA or WCDMA mobile station transmit power is most often adjusted to less than 10 mW, and frequently less than 1 mW, with only rare excursions to transmitted power greater than 100 mW. When the transmitted power is small, envelope tracking provides minimal benefits in total power consumed. However, switched converters are very inefficient at low power levels because of the substantial fixed overhead of switching power and controller power. It is well-known that substantial improvements in converter efficiency may be obtained in this case by making the switching transistors inactive for a period of time, allowing the load to discharge a storage capacitor until the output voltage drops to a voltage below the minimum desired. This form of operation is variously known as hysteretic control, pulse skipping, burst mode, or pulse frequency modulation.

Another application area in which rapid adaptation of voltage is useful occurs when a converter is used to supply power to a digital circuit, such as an applications processor, whose supply voltage is dynamically scaled to improve performance. In particular, it may be useful to greatly reduce the supply voltage to the digital circuit, or to one or more circuit blocks, often known as power islands, when they are inactive or in low-power operation, and then rapidly return the supply voltage to the original value or another high value, preferably while preserving any energy stored in an output capacitance. It may also be useful to rapidly adjust the voltage supplied to a digital circuit or power island.

It is desirable to have methods and apparatuses for voltage regulation that provides both high bandwidth/high power and low bandwidth/low power regulated voltages. It is further desirable to have methods and apparatuses for voltage regulation supporting fast changes in operating voltage with minimal dissipation or energy loss.

SUMMARY

An embodiment includes a voltage regulator. The voltage regulator includes a series switch element, and a shunt switch element, wherein a switching voltage is generated through controlled closing and opening of the series switch element and the shunt switch element. The voltage regulator further includes a switched output filter for filtering the switching voltage and generating an output voltage, wherein the switched output filter comprises a plurality of capacitors that are selectively connected and included within the switched output filter. The voltage regulator further includes a mode controller, wherein the mode controller is operative to disconnect at least one of the plurality of capacitors upon receiving a first indicator, where disconnecting causes the at least one of the plurality of capacitors to electrically float, wherein while the at least one capacitor is disconnected the output voltage is changed from a first value to a second value, return the output voltage to at least one of the first value or a third value upon receiving a second indicator, and reconnect the at least one of the plurality of capacitors.

Another embodiment includes a method of operating a voltage regulator. The method includes generating a switching voltage through controlled closing and opening of a series switch element and a shunt switch element, and generating, by a switchable output filter, a regulated output voltage by filtering the switching voltage, wherein the switchable output filter comprises a plurality of capacitors that are selectively included within the switchable output filter. The method further includes disconnecting at least one of the plurality of capacitors upon receiving a first indicator, where disconnecting causes the at least one of the plurality of capacitors to electrically float, wherein while the at least one capacitor is disconnected the output voltage is changed from a first value to a second value, returning the output voltage to at least one of the first value or a third value upon receiving a second indicator, and reconnecting the at least one of the plurality of capacitors.

Another embodiment includes a digital system voltage supply device. The digital voltage supply device includes a series switch element, and a shunt switch element, wherein a switching voltage is generated through controlled closing and opening of the series switch element and the shunt switch element. The digital system voltage supply device further includes a switched output filter for filtering the switching voltage and generating an output voltage, wherein the switched output filter comprises a plurality of capacitors that are selectively connected and included within the switched output filter. For an embodiment, the digital system voltage supply device powers a digital system, optionally including one or more power islands, wherein the output voltage is connected to the system, or to one or more power islands within the system. The digital voltage supply device further includes a mode controller, wherein the mode controller is operative to disconnect at least one of the plurality of capacitors upon receiving a first indicator, where disconnecting causes the at least one of the plurality of capacitors to electrically float, wherein while the at least one capacitor is disconnected the output voltage is changed from a first value to a second value, return the output voltage to at least one of the first value or a third value upon receiving a second indicator, and reconnect the at least one of the plurality of capacitors.

Another embodiment includes a voltage regulator. The voltage regulator includes a series switch element, and a shunt switch element, wherein a switching voltage is generated through controlled closing and opening of the series switch element and the shunt switch element, a switched output filter for filtering the switching voltage and generating an output voltage, wherein the switched output filter comprises a plurality of capacitors that are selectively connected and included within the switched output filter, and a mode controller. For this embodiment, the mode controller is operative to disconnect at least one of the plurality of capacitors upon receiving a first indicator, where disconnecting causes the at least one of the plurality of capacitors to electrically float, charge the at least one of the plurality of capacitors from the first value of the output voltage to within a threshold of a second value of the output voltage using a current source, and reconnect the at least one of the plurality of capacitors.

Other aspects and advantages of the described embodiments will become apparent from the following detailed description, taken in conjunction with the accompanying drawings, illustrating by way of example the principles of the described embodiments.

BRIEF DESCRIPTION OF THE DRAWINGS

FIG. 6 is a flow chart that includes steps of a method of operating a multiple mode voltage regulator according to an embodiment.

DETAILED DESCRIPTION

The described embodiments provide examples of implementations of voltage regulators that include multiple modes of operation. Exemplary modes include an envelope tracking mode (ETM) and a pulse skipping mode (PSM). The two modes can generally be described as high-bandwidth and low-bandwidth modes. For the ETM, the output of the voltage regulator can change substantially faster than it can for the PSM. Alternatively, for an embodiment, the operating modes include a high-power mode with a large output capacitance, and a low-power mode with a small output capacitance.

Some power supply implementations support only one or two of the modes of operation. Switched-mode power supplies suitable for envelope tracking may not be optimized for low-power operation. Highly-efficient hysteretically switched low-power supplies vary in frequency when load varies, leading to undesired spurious transmitted signals. The described embodiments support all three modes (that is, for example, the ETM (envelope tracking mode), the PSM (pulse skipping mode), and a pulse width modulation (PWM) mode) of operation from a single switched-mode converter, with the mode of operation being adaptively adjusted to provide the best performance for a given operating condition.

An embodiment of a switched-mode regulator or power supply may be required to have a large value of output capacitance (for example, 2 or more microfarads) for proper operation while in a pulse skipping mode. However, it may not be possible to also support a high-frequency mode (such as, an envelope tracking mode) with this high-value of capacitance at the output of the switched-mode regulator. The described embodiments include voltage regulators that include modes that support both the high capacitance needed for a low bandwidth pulse skipping mode, and the high bandwidth (fast changing) output needed for an envelope tracking mode.

Figure 1:
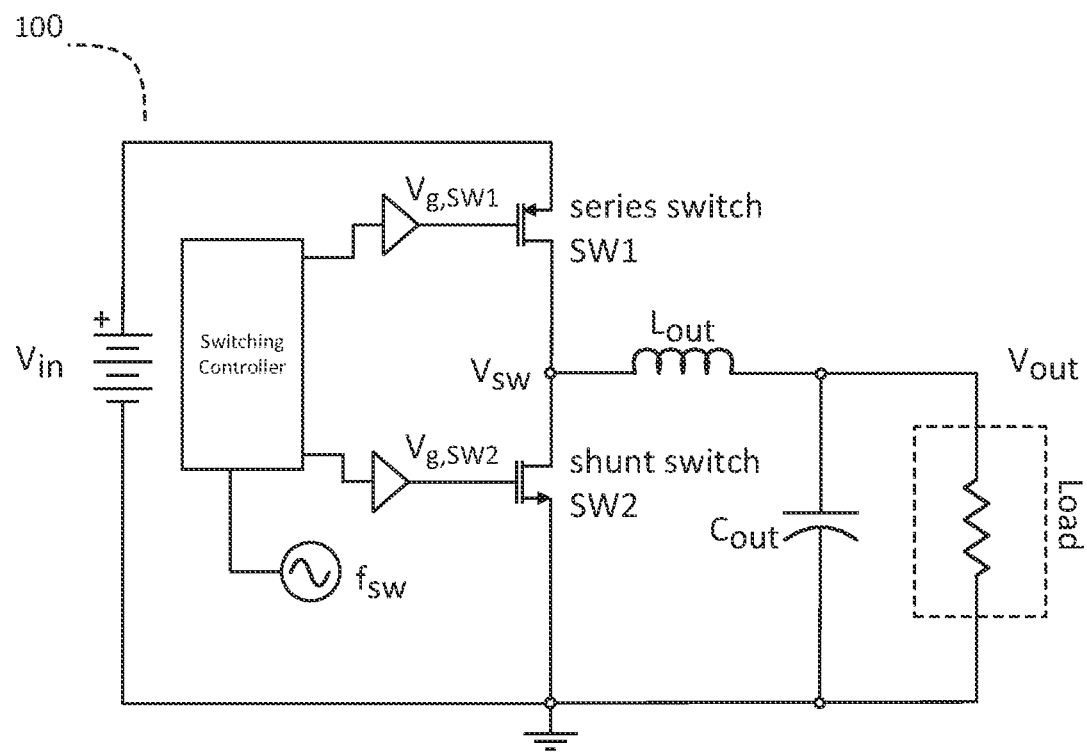
FIG. 1 shows an example of a prior art voltage regulator.
Figure 2:
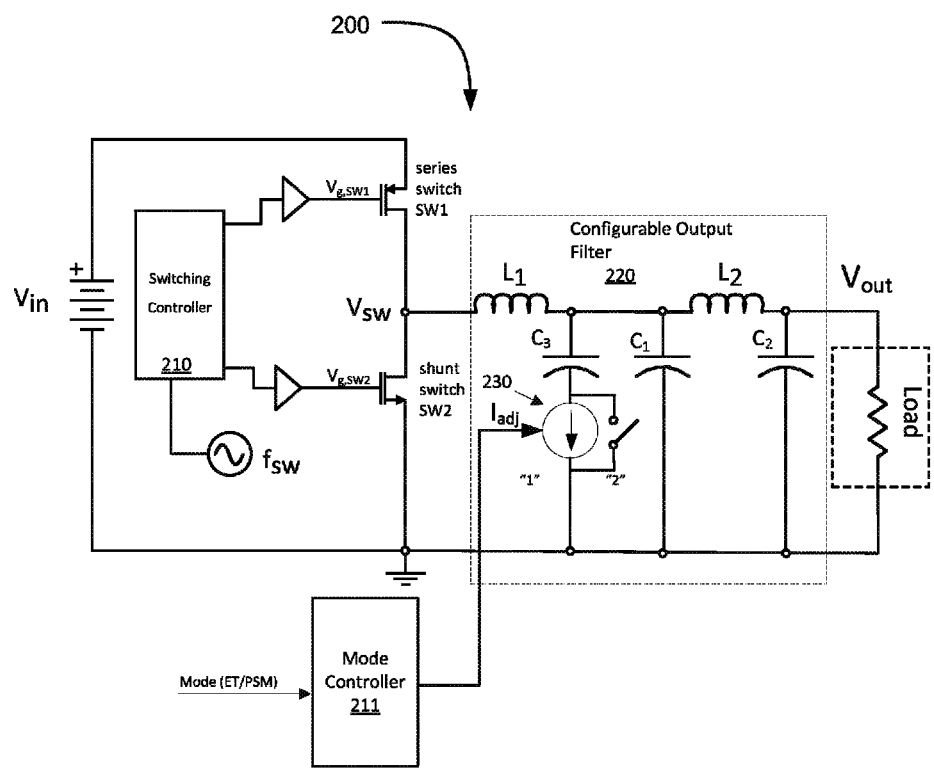
FIG. 2 shows an example of a multiple mode voltage regulator according to an embodiment.

FIG. 2 shows an example of a multiple mode switching voltage regulator 200 according to an embodiment. The switching voltage regulator 200 includes a series switch element (SW1), a shunt switch element (SW2), a switching controller 210, and a switched output filter 220. For at least one embodiment, the switching controller 210 is configured to generate a switching voltage through controlled closing and opening of the series switch element (SW1) and the shunt switch element (SW2). For at least one embodiment, the switched output filter 220 filters the switching voltage and generates a regulated output voltage, wherein the switched output filter 220 includes a plurality of capacitors (such as, capacitors $C_3$ and $C_1$, and optionally, $C_2$) that are selectively included within the switched output filter 220. The capacitive value of C3 is substantially larger than C1. For an embodiment, C3 is utilized during the pulse skipping mode of the multiple mode switching voltage regulator 200.

As shown in FIG. 2, during a charging period "1", a current source 230 charges the PSM capacitor $C_3$ during pulse skipping mode operation, and during a charged period "2", the current source 230 is effectively replaced with a closed switch, thereby connecting the PSM capacitor $C_3$ to ground. A mode controller 211 is shown in FIG. 2 for controlling the inclusion and current adjustment of the current source 230. While shown as a separate mode controller 211, it is to be understood that at least some embodiments include the switching controller 210 and the mode controller 211 being a common or shared controller.

If, for example, a simple switch was used to connect the capacitor $C_3$ (that is, for example, connect $C_3$ to ground) during PSM operation, the output voltage would undergo a sudden change when the switch transitions from the OFF state to the ON state. The magnitude of the change would be dependent on the charge stored on the PSM capacitor $C_3$, which in turn depends on the past history of the system. In typical conditions this sudden disturbance can be as large as the largest recent change in the target output voltage, and will persist until the converter is able to restore regulation. In many applications, such large disturbances in output voltage are undesirable or unacceptable.

Disturbances in the output voltage can be minimized by taking advantage of the fact that the PSM switch device (shown as a current source 230) can be implemented as a transistor. It is well-known that a transistor can be configured as a current source as long as the voltage applied to the drain (for an FET) or collector (for a BJT) is sufficient to ensure operation in the saturated region. A commonly-employed approach is to connect the gate or base of a large transistor to that of a smaller but otherwise identical transistor, through which a known small current is forced to pass. The current through the larger transistor is then proportional to the current through the small transistor; this arrangement is known as a current mirror. Other means may also be used. Thus, the switch transistor can be used as a ramped current source during the transition between an operating mode in which the PSM capacitor ($C_3$) is not connected (such as envelope tracking) and an operating mode in which it is connected. The output voltage may be rapidly stabilized at the target output value, and the PSM capacitor ($C_3$) can be controllably charged to that target output voltage, without unwanted disturbances in the output.

Figure 3A:
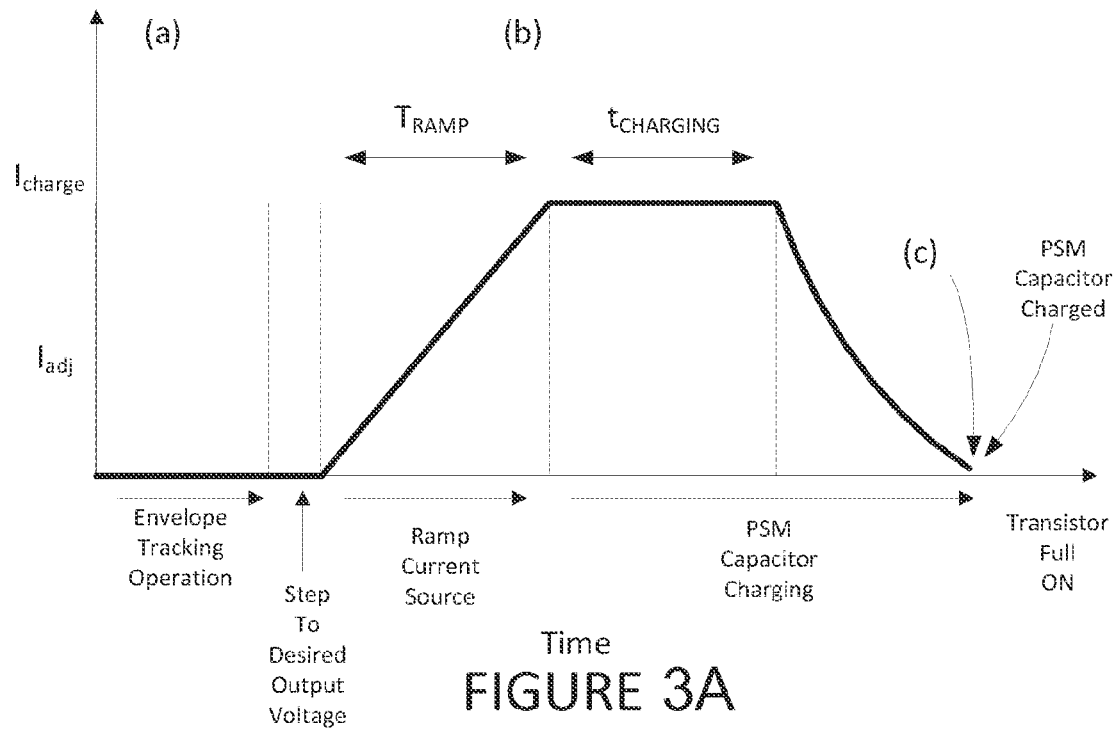
FIG. 3A shows an example of a waveform of a current source that charges a capacitor of a pulse skipping mode (PSM) of the voltage regulator of FIG. 2.
Figure 3B:
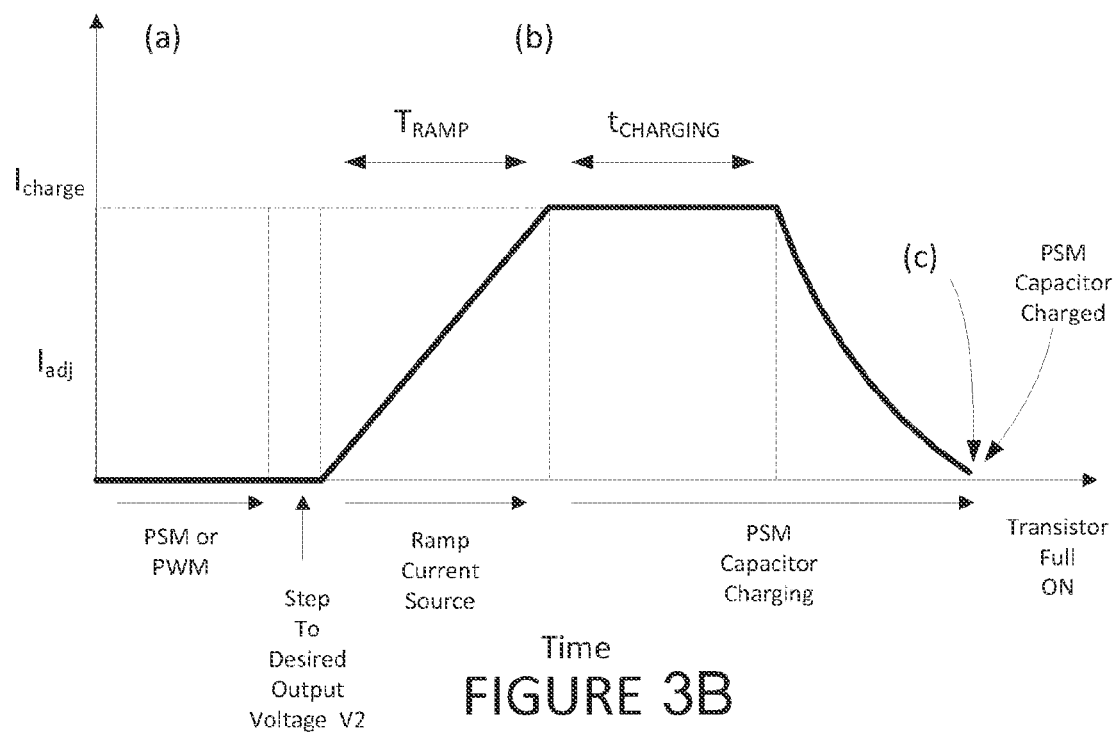
FIG. 3B shows an example of a waveform of a current source that charges a capacitor of a PSM or PWM (pulse width modulation) mode of the voltage regulator of FIG. 2 when transitioning from a first voltage to a second voltage.

FIG. 3A shows an example of a waveform of a current source that charges a capacitor of a pulse skipping mode (PSM) of the voltage regulator of FIG. 2. Initially, the voltage regulator is in an envelope tracking (mode (a)). In order to employ the current source 230, the converter continues to operate in pulse-width-modulated (PWM) mode during the process of charging the PSM capacitor (mode (b)). When envelope tracking operation terminates, rather than immediately turning on the PSM switch, embodiments are configured to provide a fixed current, and the current is ramped from 0 to a maximum value. It is to be understood that the currents depicted in FIGS. 3A and 3B are averaged over the switching cycle of the series and shunt switches for clarity. It is to be appreciated that a voltage source whose value is linearly ramped in time is equivalent to a constant current source in this context, and may be substituted for the current source 230 depicted in FIG. 2.

Referring to FIG. 3A, the rate at which the current source is ramped is set by the maximum disturbance allowed in the output voltage, typically established by the requirements of a given application, and the bandwidth of the PWM controller. A convenient estimate of the ramp rate may be obtained if the active output impedance of the converter as a function of frequency ω is known from measurement or simulation. Using an equivalent frequency $\omega_{eq} \approx 1/(t(ramp))$, the voltage disturbance $\delta V_{OUT}$ may be estimated as $$\delta V_{OUT} = |Z_{OUT}(\omega_{eq})| I_{CHARGE}$$

The ramp time and current level may be adjusted as needed to keep the disturbance within the predetermined bounds set by the application requirement. During the current source ramp and charging operations, the PSM switch absorbs the difference between the target output voltage and the voltage across the PSM capacitor. The output voltage is set by the charge state of $C_1$ and $C_2$, which are chosen to be small for envelope tracking operation. Therefore the output voltage may be readily adjusted as desired, independently of the time required to charge the PSM capacitor.

The magnitude of the current $I_{adj}$ is chosen to provide sufficiently fast charging response, for a given output capacitor $C_{PSM}$ (shown as $C_3$ in FIG. 2) and range of voltages $V_{OUT}$, to satisfy the requirements of a given application without exceeding the output current capacity of the converter. The time required is proportional to the difference between the initial voltage across the PSM capacitor and the target output voltage:

$$t_{CHARGE} < \frac{C_{PSM}(V_{PSM\ cap,start} - V_{OUT})}{I_{CHARGE}}$$

When the voltage across the PSM capacitor nears the output voltage, the current through the PSM switch transistor will fall as it enters linear operation. When the voltage across the PSM switch transistor is sufficiently close to 0, the PSM switch transistor can be set to turn fully on without further disturbance in the output voltage (mode (c)). The PSM capacitor is fully charged, and the converter may continue to operate in PWM mode, or may transition to PSM mode as previously described.

FIG. 3B shows an example of a waveform of a current source that charges a capacitor of a PSM or PWM (pulse width modulation) mode of the voltage regulator of FIG. 2 when transitioning from a first voltage to a second voltage. For this embodiment, the PSM capacitor is momentarily switched out when changing the regulated output voltage from the first value to the second value. Initially, the voltage regulator is in the PSM or the PWM (mode (a)). In order to employ the current source 230, the converter continues to operate in PSM or PWM mode during the process of charging the PSM/PWM capacitor (mode (b)). When stepping the regulated voltage from the first value to the second value, rather than immediately turning on the PSM switch, embodiments are configured to provide a fixed current, and the current is ramped from 0 to a maximum value. As previously stated, it is to be understood that the currents depicted in FIGS. 3A and 3B are averaged over the switching cycle of the series and shunt switches for clarity.

Similar to the description of FIG. 3A, the rate at which the current source is ramped is set by the maximum disturbance allowed in the output voltage, typically established by the requirements of a given application, and the bandwidth of the PWM controller.

Figure 4:
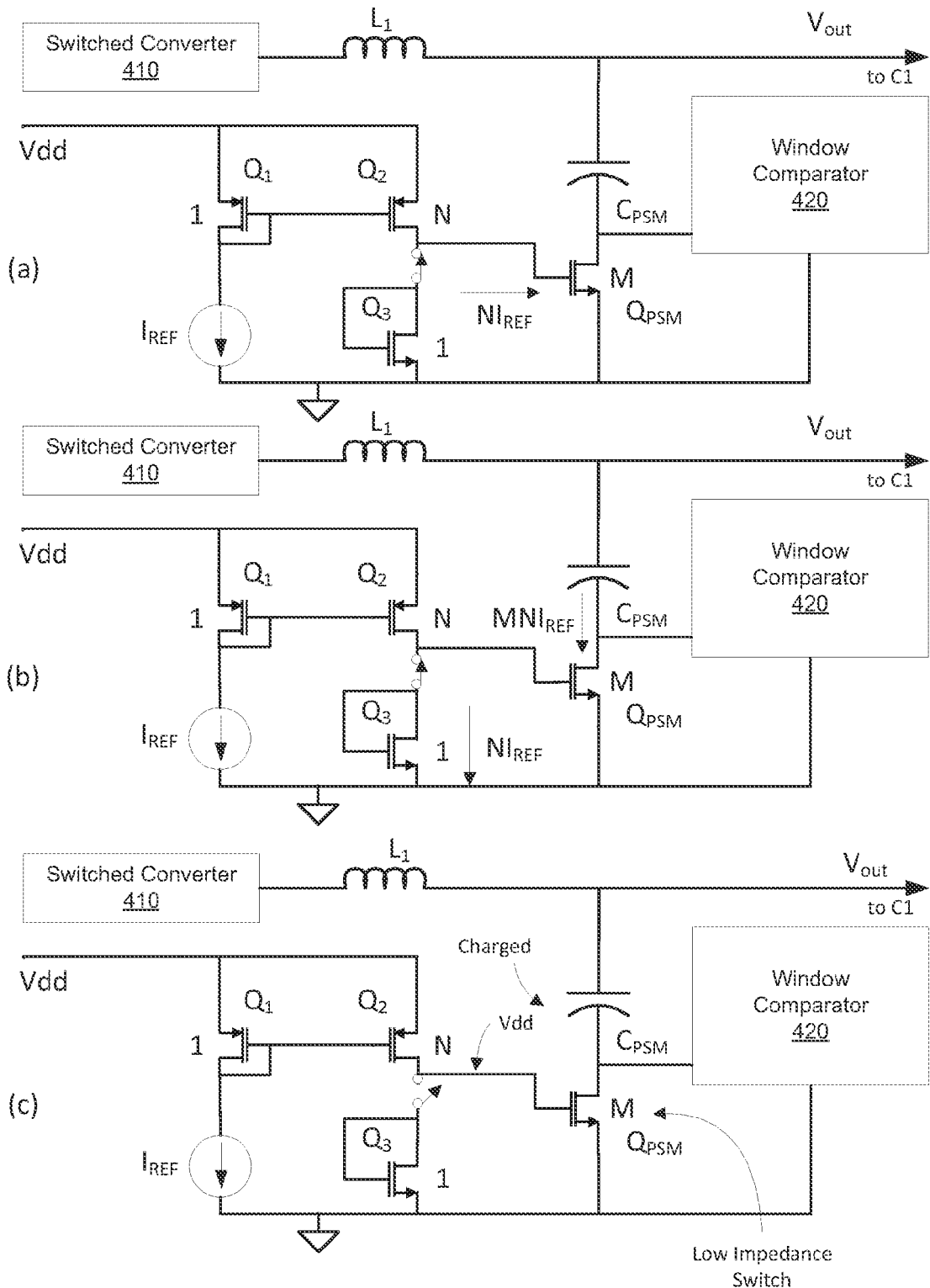
FIG. 4 shows a schematic of circuitry that can be utilized to control charging of the PSM capacitor of FIG. 2 according to an embodiment.

FIG. 4 shows a schematic of circuitry that can be utilized to control charging of the PSM capacitor ($C_3$) of FIG. 2 according to an embodiment. The three successive circuits reflect the three modes ((a)—ramping mode, (b)—current source mode, (c)—charged mode) shown in FIG. 3A. The capacitor $C_3$ of FIG. 2 is depicted as $C_{PSM}$ in FIG. 4. A first current mirror composed of transistors $Q_1$ and $Q_2$ provides a multiplied reference current $NI_{REF}$, which is initially directed to the gate of the PSM switch transistor $Q_{PSM}$, as shown in part (mode (a)) of FIG. 4. The magnitude of $NI_{REF}$ is chosen to provide the desired ramp time $t_{RAMP}$ for the known values of gate capacitance and threshold voltage of $Q_{PSM}$.

As the current through $Q_{PSM}$ increases, the scaled current through $Q_3$ also increases. By the end of $t_{RAMP}$, all the current from $Q_2$ is directed to $Q_3$, and the current through $Q_{PSM}$ is constant at the desired value of $MNI_{REF}$ (mode (b)) selected as noted above to provide suitable charging times without exceeding the ability of the Switched Converter 410 to source the requisite current. When the voltage on the bottom plate of the capacitor $C_{PSM}$ becomes sufficiently small to fall within the window range of a Window Comparator 420, the gate of $Q_{PSM}$ can be taken high to fully turn the FET on (mode (c)). The width of the comparator window is chosen to ensure that the resulting disturbance of the output voltage is acceptably small for the application.

When the transistor $Q_{PSM}$ is off, the bottom plate of the capacitor $C_{PSM}$ is floating, and follows changes in the output voltage. In particular, if the output voltage decreases substantially from that at which the PSM capacitor voltage was set, the instantaneous potential on the bottom plate of the capacitor may be lower than ground (less than 0). If the transistor $Q_{PSM}$ is implemented as an NMOS transistor, a negative voltage of magnitude greater than the diode forward voltage $V_f$ applied to the drain diffusion will cause it to become forward-biased if the well or body potential is held at ground. The forward-biased diode will rapidly discharge the PSM capacitor, temporarily clamping the output voltage. This is undesirable during envelope tracking operation. Therefore, when an MOS transistor is used, it must be placed in a well, and the well potential must be configured to be connected to either the drain or source side of the transistor, as required to avoid undesired forward bias of the source or drain diffusions.

Again referring to FIG. 2, embodiments include the controller determining whether the switching voltage regulator is switching from an envelope tracking mode to a non-envelope tracking mode. For a more specific embodiment, this includes the controller determining whether the switching voltage regulator is switching from an envelope tracking mode to a pulse skipping mode. For another embodiment, this includes the controller determining whether the switching voltage regulator is switching from a high-bandwidth mode to a low-bandwidth mode. For an embodiment, the selection of the settings of the switched output filter can be made as frequently as once per slot of a transmission protocol of a communications device utilizing the switching voltage regulator.

For some embodiments, the controller receives an indicator that the switching voltage regulator is switching from the envelope tracking mode to the pulse skipping mode. The mode can be selected, for example, by a controller of a mobile device in which the switching voltage regulator is located.

As previously described, embodiments of the switching output filter include a PSM capacitor, wherein the PSM capacitor is charged when the switching voltage regulator is determined to be switching from the envelope tracking mode to the pulse skipping mode. Specifically, the PSM capacitor is charged until a voltage on the PSM capacitor is approximately equal to an output voltage while maintaining a voltage ripple on the output voltage within a predetermined threshold.

Also as previously described, an embodiment of the switching voltage regulator includes a current source for charging the PSM capacitor when the switching voltage regulator is determined to be switching from the envelope tracking mode to the pulse skipping mode. The PSM capacitor is charged until the voltage on the PSM capacitor is set equal to the output voltage without undue disturbance of the output voltage. What is considered to be an undue disturbance is generally application specific, and sets the maximum allowed ripple on VOUT.

For at least some embodiments, a magnitude of current conducted or sourced by the current source comprises ramping that magnitude upon determining the switching voltage regulator is switching from the envelope tracking mode to the pulse skipping mode. As previously described, for an embodiment, the charging ramp (as shown in FIG. 3A) of the conducted current is chosen to provide sufficiently fast charging response, for a given output capacitor $C_{PSM}$ and range of voltages $V_{OUT}$, to satisfy the requirements of a given application without exceeding the output current capacity of the converter.

For an embodiment, when the transitioning from envelope tracking to non-envelope tracking is detected, settings of the switched output filter are incrementally adjusted to decrease a series resistance of a non-envelope tracking capacitance of the switched output filter. That is, as will be shown in FIG. 5, the large PSM capacitor is switched in with a series resistance that gradually decreases.

The described embodiments can be utilized for other purposes than switching of modes. More specifically, the described embodiments can more generally be used for rapidly switching a regulated voltage from one value to another value. For faster changes in a regulated output voltage, an embodiment includes switching out a PSM or other large-value capacitor, such as $C_3$, when changing the regulated output voltage from a first value to a second value. In an embodiment, dynamic voltage scaling of a digital circuit supply voltage may be supported using the described mechanism for switching out a large-value capacitor to allow rapid readjustment of the supply voltage from a first value to a second value. An embodiment further includes a current source for charging the capacitor $C_3$ after the regulated output voltage has changed to the second value, wherein a magnitude of current conducted or sourced by the current source is ramped.

It should be noted that this embodiment includes a rapid change from the first value to the second value, and the previously described PSM mode is not applicable. For this embodiment, the large capacitor $C_3$ is momentarily switched out of the configurable output filter to allow the rapid voltage change of the regulated voltage.

The rate of change of the regulated voltage can be dependent upon the application, and includes the time required to slew the envelope tracking capacitor(s) $C_2$ and optionally $C_3$ to the desired regulated output voltage. The described embodiments of multiple mode voltage regulators can be utilized in mobile devices. The mobile devices can utilize a wireless communication protocol such as WCDMA. Typically, the communication protocol includes slot boundaries wherein spurious signals that would be suppressed by the larger capacitor $C_3$ are not required to be suppressed. Therefore, the slot boundaries provide opportune times for rapidly changing the regulated output voltage, and temporary disconnection of the larger capacitor $C_3$. However, the change in the regulated output voltage should be completed within the time allotted by the slot boundary. The time improvement in slewing from the first voltage to the second voltage for a given maximum current of the voltage converter can be approximated by (C3/(C1+C2)), and can be selected by design within the constraints of the switching frequency.

Figure 5:
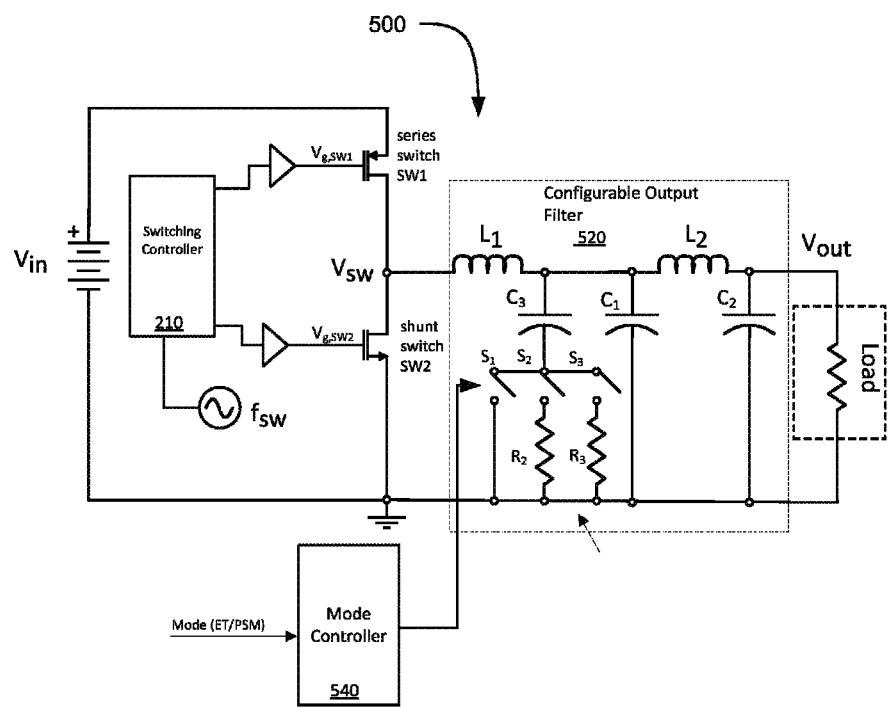
FIG. 5 shows an example of a multiple mode voltage regulator according to another embodiment.

FIG. 5 shows an example of a multiple mode voltage regulator 500 according to another embodiment. This embodiment for charging the PSM capacitor with limited output disturbance employs a number of switches and varying series resistor values. Two or more switches are provided in parallel to connect the bottom plate of the PSM capacitor to ground, with varying values of resistance connected in series with some or all of the switches. The resistances act to limit the maximum charging current that can flow, and thus the maximum disturbance to the output voltage that can result. For the embodiment depicted in FIG. 5, the configurable output filter 510 includes three switches $S_1, S_2, S_3$, two with series resistors $R_2, R_3$, which are controlled by the mode controller 540. To understand the operation of this circuit, first assume that all the switches are open, as shown, a configuration appropriate for envelope tracking operation. In order to transition to PSM or PWM operation with the PSM capacitor connected, as a first step, switch $S_3$ is closed, connecting resistor $R_3$ between the bottom place of $C_{PSM}$ and ground. Resistor $R_3$ is presumed here to be a large value, such as 50 ohms, resulting in a small change in the output voltage when the switch is closed. Once the PSM capacitor is partially charged, switch $S_2$ is closed. The resistor $R_2$ is a smaller value than $R_3$, such as 25 ohms. The relative values of the resistors are chosen to correspond to the remaining charge on $C_{PSM}$ when they are switched into the circuit, so that each switching event produces an acceptably small disturbance in $V_{out}$. In the example shown in the figure, once the voltage on $C_{PSM}$ is smaller than the maximum allowed output disturbance, switch $S_1$ is closed, and the bottom plate of the PSM capacitor is tied to ground.

Presuming that the closure of each switch is fast relative to the response time of the converter, the disturbance in output voltage at each switch event is approximately equal to the ratio of the equivalent open-loop resistance of the converter to the series resistance, multiplied by the voltage across the PSM capacitor at the moment the switch is closed:

$$\delta V_{out,SWn} = R_{CONV} \delta G_n V_{CPSM}$$

where n is the identifier for the switch being closed, and $\delta G_n$ is the change in conductance presented to the bottom plate of the PSM capacitor when switch n is closed. For example, let us assume the largest output disturbance allowable is 40 mV. If the converter appears to have an open-loop output resistance of 1 ohm, the values of $R_1$ and $R_2$ are respectively 50 and 35 ohms, and 2 volts are initially present across the PSM capacitor, the first step will be:

$$\delta V_{out,SW3} = 1\left(\frac{1}{50}\right)2 \approx 40 \text{ mV}$$

The closed-loop response of the regulator will compensate for this disturbance after a response time, returning the output voltage to the regulated target value. If the voltage across the capacitor has fallen to 1 V at the time of the next step, the output voltage disturbance will be:

$$\delta V_{out,SW2} = 1\left(\left[\frac{1}{25} + \frac{1}{50}\right] - \frac{1}{50}\right)1 \approx 40 \text{ mV}$$

The voltage on the PSM capacitor bottom plate is then allowed to fall to 40 mV, after which $S_1$ is closed and the process is complete. The total time required is determined by the RC time constants of the various configurations, and the extent to which each step must discharge the initial voltage. More stages of resistors may be added to reduce the total time required to charge the PSM capacitor, if required by the envisioned application.

As noted above, if the switches $S_1$, $S_2$, and so on, are implemented as MOS devices, it may be necessary to account for the possibility of polarity inversion in establishing the body voltages, to avoid unintended forward-biased junctions.

The PSM capacitor charging mechanism can also be used in the case where the target output voltage of a converter needs to be rapidly changed at infrequent intervals, and remains constant between those intervals. The PSM capacitor is connected to the output in constant-voltage operation. When a change in target output voltage is required, the PSM capacitor is disconnected by opening the PSM switch or switches, and a new target output voltage is provided to the converter. Since the PSM capacitor is not connected, the converter needs only to charge the remaining capacitances, such as $C_1$ and $C_2$ in FIG. 2, where these capacitances have been chosen to allow rapid changes in the output voltage as described previously. The total amount of charge required is greatly reduced from that used to change the output voltage of the larger $C_{PSM}$, so the output voltage can be rapidly stabilized at the new value. After the new target output voltage is reached, the PSM capacitor charging operation described above can be performed. At the end of the procedure, the PSM capacitor is again connected to the output voltage, and the output voltage level has remained substantially constant at the new target value.

During the period when the PSM or other large capacitor, such as $C_3$ of FIG. 2, is disconnected, the response of the output voltage of the converter to changes in duty cycle is more rapid than when a large value capacitor is connected; equivalently, the unity-gain bandwidth of the converter increases, and the frequency of the output resonance resulting from e.g. inductor $L_1$ and the various output capacitances is changed. The output voltage control mechanism of the converter must account for this change to preserve stable operation. For example, using the nomenclature of Venable, a type-III voltage-mode compensation loop may be used for PSM or other low-bandwidth operation with a large capacitor such as $C_3$ connected to the circuit, whereas a type-II compensation loop may be required when the large capacitor is disconnected or charging.

FIG. 6 is a flow chart that includes steps of a method of operating a multiple mode voltage regulator according to an embodiment. A first step 610 includes generating, by a switching controller, a switching voltage through controlled closing and opening of a series switch element and a shunt switch element. A second step 620 includes generating, by a switchable output filter, a regulated output voltage by filtering the switching voltage, wherein the switchable output filter comprises a plurality of capacitors that are selectively included within the switchable output filter.

As described, embodiments include determining whether the switching voltage regulator is switching from an envelope tracking mode (high-bandwidth mode) to a non-envelope tracking mode (low-bandwidth mode).

As described, embodiments include the switching voltage regulator receiving an indicator that the switching voltage regulator is switching from the envelope tracking mode to the non-envelope tracking mode.

As described, embodiments include a switchable output filter that includes a PSM capacitor, and further includes charging the PSM capacitor when the switching voltage regulator is determined to be switching from the envelope tracking mode to the non-envelope tracking mode.

As described, for embodiments a magnitude of current conducted or sourced by the current source comprises ramping the value of the current source upon determining the switching voltage regulator is switching from the envelope tracking mode to the non-envelope tracking mode.

As described, embodiments include selecting one of two or more switched output filter settings. For a specific embodiment, the settings of the switchable output filter are selected as frequently as once per slot of a transmission protocol of a communications device utilizing the switching voltage regulator.

At least some embodiments include switching out a PSM capacitor when changing the regulated output voltage from a first value to a second value, until a desired regulated output voltage is obtained. More specifically, an embodiment includes charging the PSM capacitor with a current source after the regulated output voltage has changed to the second value, wherein a magnitude of current conducted or sourced by the current source is ramped.

Figure 7:
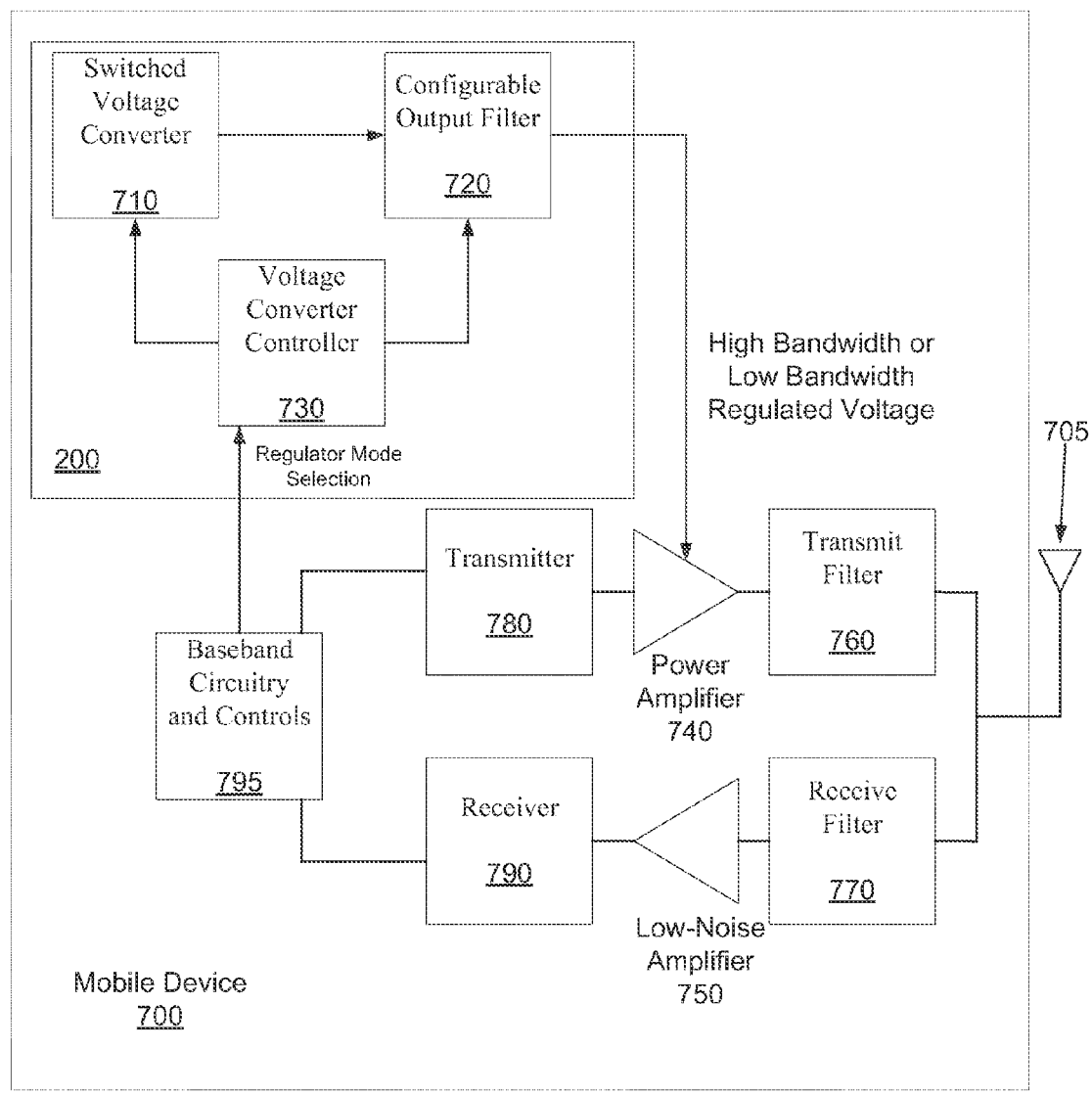
FIG. 7 is a block diagram of a mobile device that includes a power amplifier that is connected to a multiple mode voltage regulator according to at least one of the described embodiments.

FIG. 7 is a block diagram of a mobile device 700 that includes a power amplifier 740 that is connected to a multiple mode voltage regulator 200 according to at least one of the described embodiments. As shown, the mobile device 700 also includes an antenna 705, a transmitter 780, a transmit filter 760, a receive filter 770, a low noise amplifier (LNA) 750, a receiver 790, and base-band circuitry and controls 795. As shown, the base-band circuitry and controls 795 provides a mode selection for the multiple mode voltage regulator 200. For an embodiment, the selection is based on whether the multiple mode voltage regulator 200 is to operate in a high bandwidth mode (for example, an envelope tracking (ET) mode) or in a low bandwidth mode (for example, the pulse skipping (PS) mode).

Similar to previously described embodiments, the multiple mode voltage regulator 200 includes a voltage converter 710 that includes a series switch element, a shunt switch element, and a switching controller configured to generate a switching voltage through controlled closing and opening of the series switch element and the shunt switch element. The multiple mode voltage regulator 200 further includes a configurable output filter 720 (that is, the switched output filter) for filtering the switching voltage and generating a regulated output voltage, wherein the configurable output filter 720 includes a plurality of capacitors that are selectively included within the configurable output filter. A voltage converter controller 730 (which can also include the switching controller) of the multiple mode voltage regulator 200 receives the mode selection from the base-band circuitry and controls 795, and selects the settings of the configurable output filter 720 accordingly. The multiple mode voltage regulator 200 then provides the high or low bandwidth regulated voltage to the power amplifier 740 accordingly.

Figure 9:
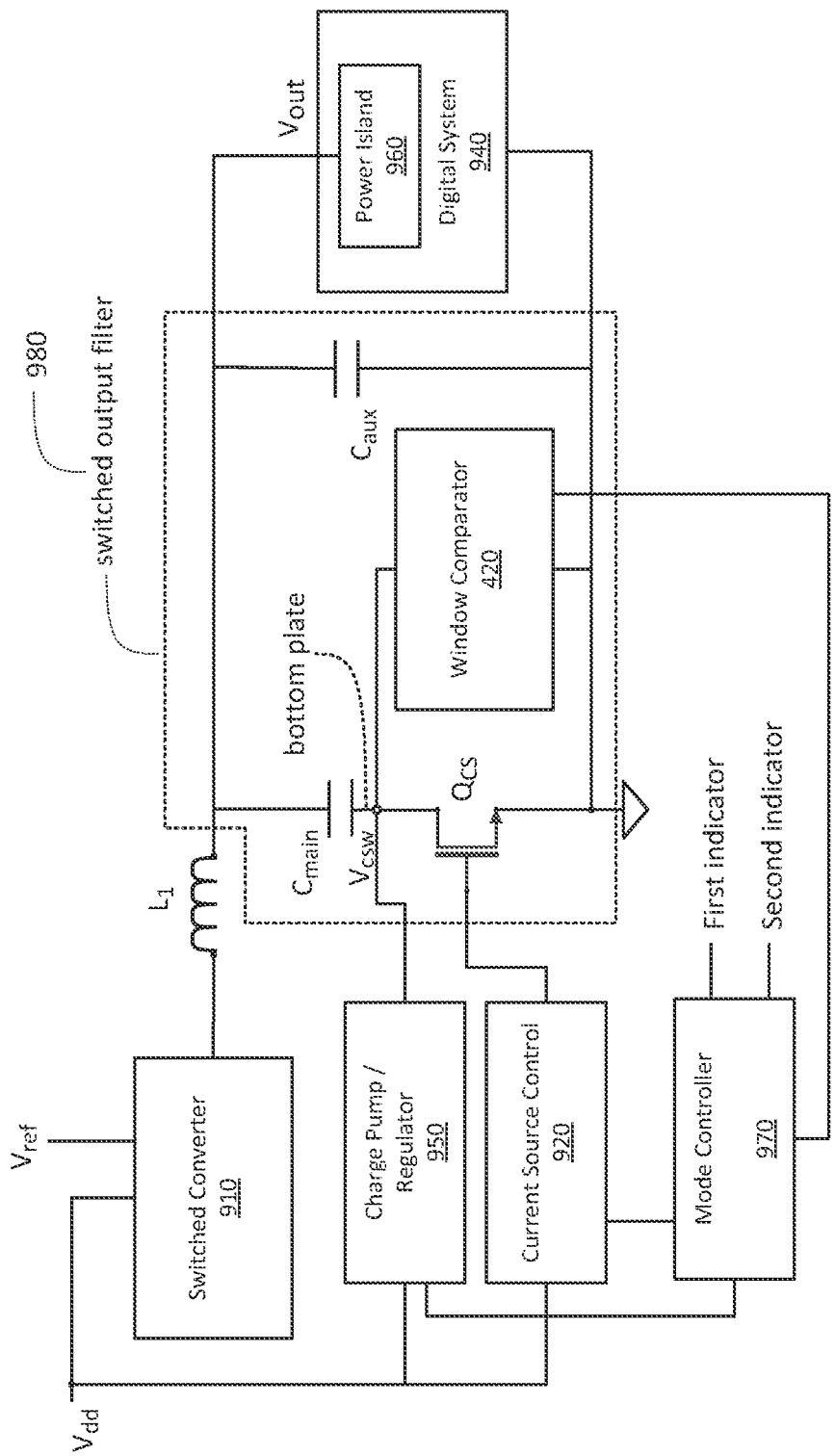
FIG. 9 shows a voltage regulator that includes a charging mechanism to preserve charge in a storage capacitor during periods of inactivity of a load circuit, while rapidly restoring the required supply voltage when the load again becomes active, according to an embodiment.

For an alternative embodiment, the charging mechanisms described above may similarly be employed to preserve charge in a storage capacitor during periods of inactivity of a load circuit, while rapidly restoring the required supply voltage when the load again becomes active. FIG. 9 shows a voltage regulator that includes a charging mechanism to preserve charge in a storage capacitor during periods of inactivity of a load circuit, while rapidly restoring the required supply voltage when the load again becomes active, according to an embodiment. This embodiment includes a switch converter 910 that includes a series switch element, and a shunt switch element, wherein a switching voltage is generated through controlled closing and opening of the series switch element and the shunt switch element. The voltage regulator further includes a switched output filter 980 for filtering the switching voltage and generating an output voltage ($V_{out}$), wherein the switched output filter 980 comprises a plurality of capacitors (such as, $C_{main}$ and $C_{aux}$) that are selectively connected and included within the switched output filter 980.

For an embodiment, the voltage regulator further includes a mode controller 970, wherein the mode controller 970 is operative to disconnect at least one (such as $C_{main}$) of the plurality of capacitors upon receiving a first indicator, where disconnecting causes the at least one of the plurality of capacitors to electrically float, wherein while the at least one capacitor is disconnected the output voltage ($V_{out}$) is changed from a first value to a second value.

It is to be understood that the bottom plate of the capacitor is said to electrically float when the leakage current in the node connected to the capacitor bottom plate is small enough that the node voltage follows changes in the top plate on the time scale of interest in the application. For an embodiment, the node voltage follows within a voltage threshold over a period of time.

For an embodiment, the mode controller 970 is further operative to return the output voltage to at least one of the first value or a third value upon receiving a second indicator, and reconnect the at least one of the plurality of capacitors.

For an embodiment, the mode controller 970 is further operative charge the at least one of the plurality of capacitors from the first value of the output voltage to within a threshold of a second value of the output voltage using a current source, and reconnect the at least one of the plurality of capacitors.

An embodiment further includes a current source (wherein the current source includes a current source controller 920 and transistor $Q_{CS}$) operative to charge the at least one of the plurality of capacitors prior to reconnecting the at least one of the plurality of capacitors. For an embodiment, the at least one of the plurality of capacitors is charged to within a threshold of the output voltage. For an embodiment, the current of the current source is maintained below a maximum current threshold while charging the at least one of the plurality of capacitors. For an embodiment, a first derivative (that is, dI/dt) of a current (I) of the current source is maintained below a change threshold while charging the at least one of the plurality of capacitors. This allows the voltage converter to provide the extra current without disturbing the output voltage.

An embodiment further includes a charge pump circuit and regulator 950 operative to maintain a bottom plate voltage of the at least one of the plurality of capacitors while the at least one of the plurality of capacitors is disconnected.

For an embodiment, the output voltage ($V_{OUT}$) is connected to a power island 960 of a digital system 940. As shown, the large storage capacitance $C_{main}$, analogous to the PSM Capacitor described above, is used to supply transient currents to a partition within a digital system, such as the power island 960 within a system-on-chip (SOC). When the load, such as the power island 960 of a digital system 940, is active, a fixed output voltage such as 1.2 V is provided. The output voltage ($V_{out}$ or $V_{active}$) may also be varied to minimize power consumption while providing adequate computational speed for a given application.

Figure 10A:
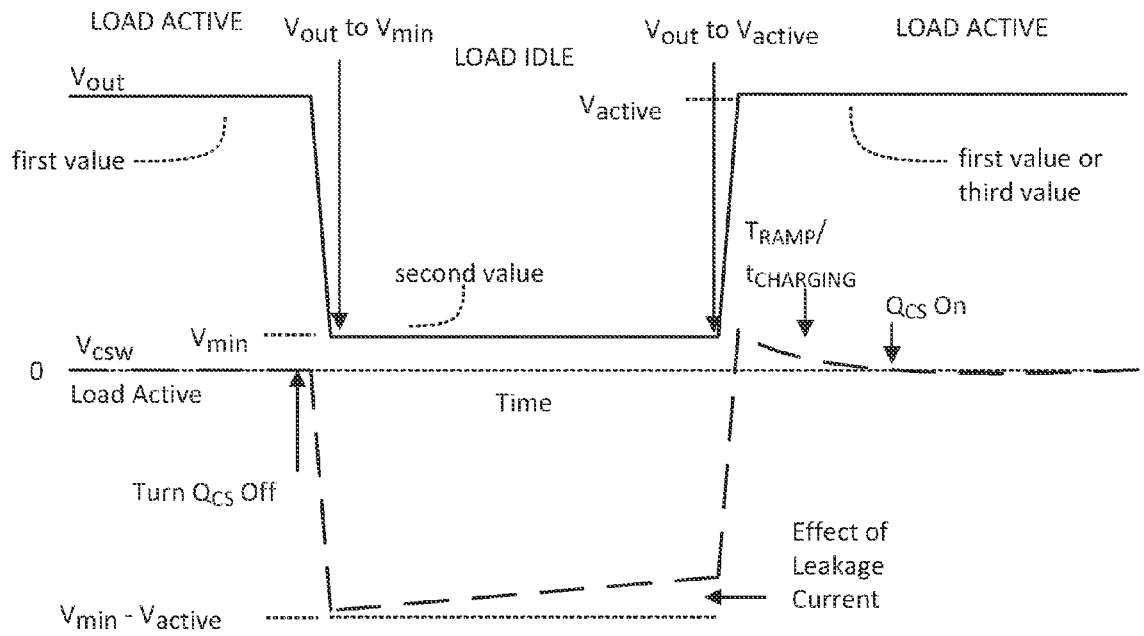
FIGS. 10A and 10B shows time-lines of a timing sequence of the operation of the voltage regulator of FIG. 9 that includes a load-active mode and a load-idle mode, according to an embodiment.
Figure 10B:
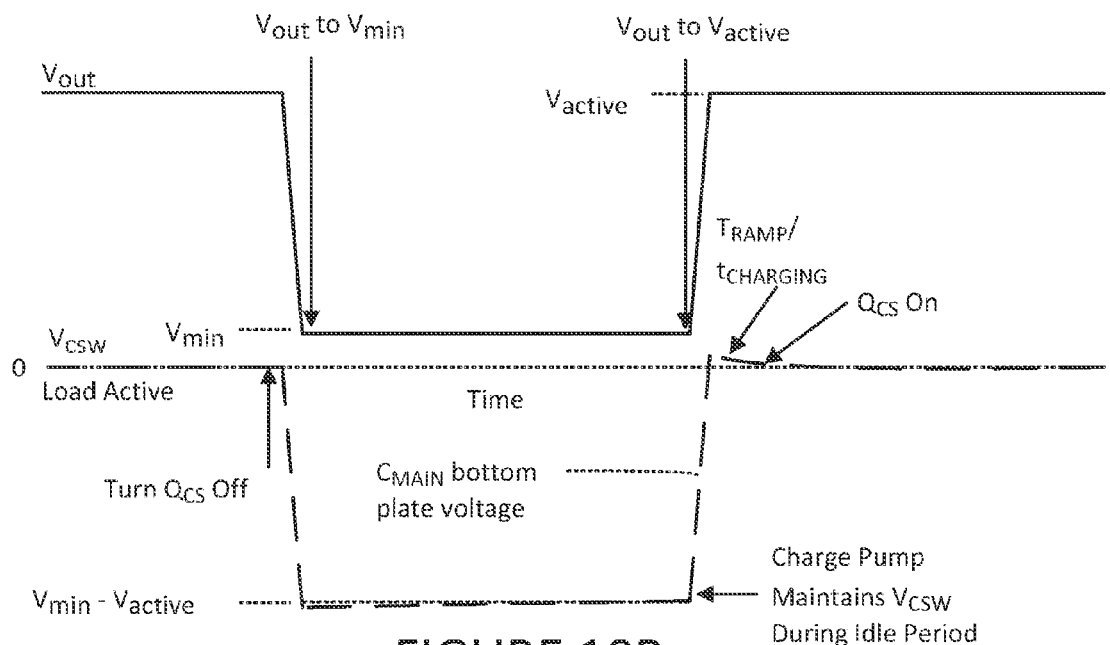

When the load is inactive, or operating in a low-power condition, it is desirable to rapidly reduce the input voltage (that is, $V_{out}$ of the converter) to a low value $V_{min}$, close to 0, to minimize power consumption. To accomplish this, for an embodiment, the transistor $Q_{CS}$ is turned off, and the converter 910 then rapidly reduces the output voltage to a minimum value discharging only the smaller capacitance $C_{aux}$. An example timing sequence is depicted in FIG. 10. During the inactive period, the upper plate of capacitor $C_{main}$ is held at the minimum voltage $V_{min}$, and the lower plate $V_{CSW}$ is negative with respect to ground. As noted above, it may be desirable to incorporate one or more charge pump circuits to generate negative voltages on the relevant junctions, preventing forward bias conditions. For example, in FIG. 9, the gate of $Q_{CS}$ must be held more negative than a threshold voltage above $V_{CSW}$ during the time period when the load is idle. If the circuit is fabricated using conventional CMOS technology, the well in which $Q_{CS}$ is formed must also be held sufficiently negative to prevent forward-biasing of the n+-to-well junctions. If the idle time is sufficiently short, the charge on the large capacitor $C_{main}$ is then preserved during the idle period. If the idle period is long enough that charge loss due to leakage current is significant, the voltage $V_{CSW}$ on the bottom plate of capacitor $C_{main}$ slowly returns to ground, as shown in FIG. 10A. The leakage currents will normally be very small if appropriate junction voltage controls have been provided. If desired, the optional charge pump and regulator 950 can be included to maintain the bottom plate $V_{CSW}$ at a substantially fixed potential ($V_{min}$-$V_{active}$), as shown in FIG. 10B. The charge pump provides a negative supply voltage, lower than the capacitor bottom place $V_{CSW}$, enabling a regulator to accurately control the value of $V_{SCW}$. Substantially conventional circuits may be employed for the regulator and charge pump, though as previously noted, careful attention to control of well potentials is required when a CMOS implementation is intended.

When the load again becomes active, the output voltage can be rapidly returned to the active value by charging only capacitor $C_{aux}$. If the voltage across large capacitor $C_{main}$ has been maintained during the inactive period, as described above, and the active supply voltage is the same as in the previous active period, the transistor $Q_{CS}$ can simply be turned on. If the supply voltage is not the same as in the previous active period, or the voltage $V_{CSW}$ has drifted towards ground due to leakage currents, the PSM capacitor charging mechanisms described above in connection with FIGS. 3, 4, and 5 may be employed to return the node $V_{CSW}$ to ground potential and reconnect $C_{main}$ to the output, without significantly affecting the voltage delivered to the load.

Because the described embodiments disconnect the large capacitor during transitions in output voltage, the peak current that must be supplied or sunk by the switching converter can be set nearly independently of the rate at which the output voltage is changed. The peak current capability of the switching converter need only be as large as the peak load current plus the charging current for the main capacitor, in contrast to conventional configurations where the displacement current $C_{main}*(dV_{out}/dt)$ must also be provided by the switched converter. Thus, the peak current capability of the switched converter can be reduced, at the cost of a longer charging delay. The switching converter must respond to load transients that occur during the charging period, when the main capacitor is not fully connected to the circuit, with sufficient speed to provide the performance required by the application.

Figure 8:
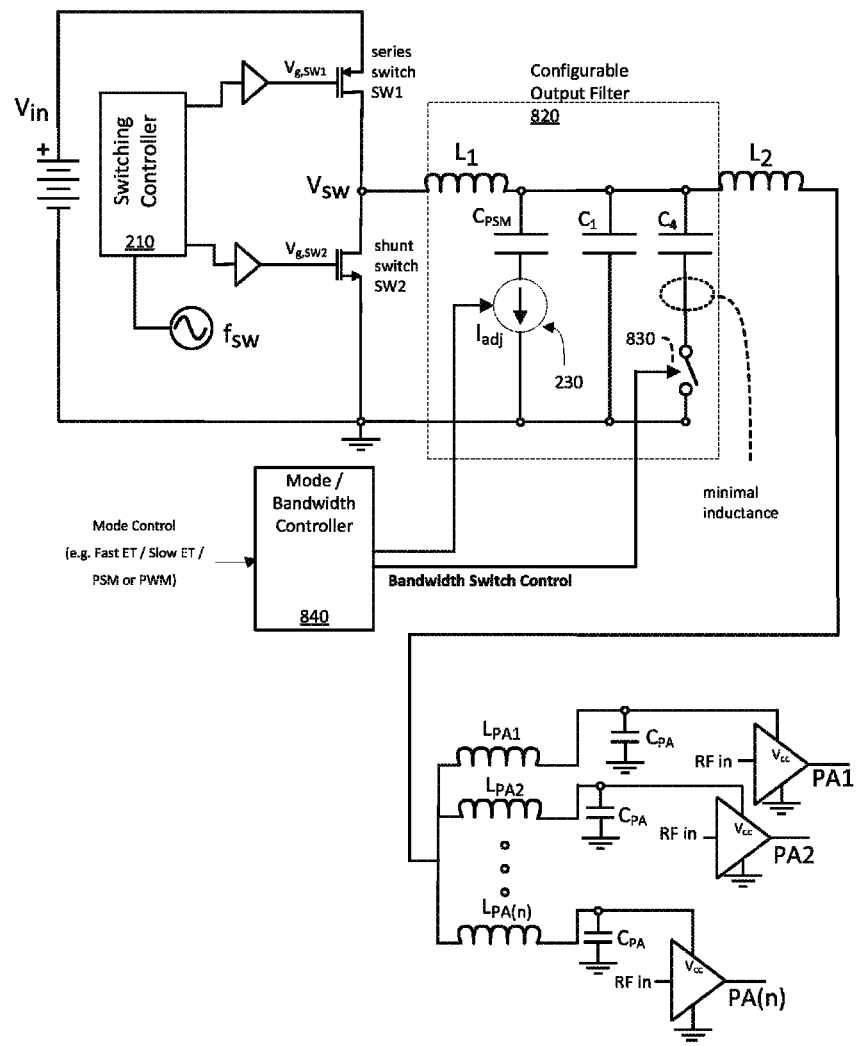
FIG. 8 shows a voltage converter that includes a configurable output filter that can switch between two or more output bandwidths, according to an embodiment.

Although the disclosed embodiments have been described in the context of changes in converter operating modes, a configurable output filter may also be employed when the operating mode of the converter is unchanged, but the detailed requirements upon the output change. For example, a configurable output filter can provide the ability to switch between two or more output bandwidths, by adjusting the capacitance presented to the output side of the inductor. An exemplary embodiment is depicted in FIG. 8. For this embodiment, in addition to a PSM capacitor $C_{PSM}$, the configurable output filter 820 includes a capacitor $C_4$ to allow reduced-bandwidth operation. A switch 830 can be closed to include $C_4$ in the circuit, reducing the resonant frequency of the output filter composed of $L_1$, $C_1$, and optionally $C_4$. In general the capacitance of $C_4$ is larger than that of $C_1$ but much smaller than that of $C_{PSM}$. The switch 830 is driven by a mode/bandwidth controller 840, wherein the mode/bandwidth controller 840 receives, for example, a Fast ET (envelope track) indicator, a Slow ET indicator, or a PSM indicator. Adjustable output bandwidth is beneficial in cases where the input bandwidth may not be constant. For example, when envelope tracking is used in the Long-Term Evolution (LTE) wireless standard, the bandwidth of the transmitted RF signal may vary depending on the number of resource blocks allocated to a given transmitter. When a lower-bandwidth signal is transmitted, a lower-bandwidth filter structure can be used to improve rejection of the switching frequency and/or low-frequency noise, thus reducing the effect of the switched converter on key RF performance measures such as adjacent channel interference. In cases where the change in output voltage is small, or the system is insensitive to output voltage variations during the bandwidth transition, it may not be necessary to make provisions for controlled transition from one capacitance state to another, as described above, and switch 830 may simply provide open and closed states. When a simple switch is insufficient, the switch 830 may operate as a controlled current source analogous to the PSM current source 230, allowing capacitor $C_4$ to be charged to the output voltage before being fully connected in the circuit. In the diagram, $L_2$ and $L_{PA1}$ through $L_{PA(n)}$ are optional, and may incorporate parasitic inductances resulting from the layout of the various circuits.

Although specific embodiments have been described and illustrated, the embodiments are not to be limited to the specific forms or arrangements of parts so described and illustrated.

The invention claimed is:
1. A voltage regulator, comprising:
  a series switch element, and a shunt switch element, wherein a switching voltage is generated through controlled closing and opening of the series switch element and the shunt switch element;
  a switched output filter for filtering the switching voltage and generating an output voltage, wherein the switched output filter comprises a plurality of capacitors that are selectively connected and included within the switched output filter;

a mode controller, wherein the mode controller is operative to:
disconnect at least one of the plurality of capacitors upon receiving a first indicator, where disconnecting causes the at least one of the plurality of capacitors to electrically float, wherein while the at least one capacitor is disconnected the output voltage is changed from a first value to a second value,
return the output voltage to at least one of the first value or a third value upon receiving a second indicator; and
reconnect the at least one of the plurality of capacitors.

2. The voltage regulator of claim 1, further comprising a current source operative to charge the at least one of the plurality of capacitors prior to reconnecting the at least one of the plurality of capacitors.

3. The voltage regulator of claim 2, wherein the at least one of the plurality of capacitors is charged to within a threshold of the output voltage.

4. The voltage regulator of claim 2, wherein a current of the current source is maintained below a maximum current threshold while charging the at least one of the plurality of capacitors.

5. The voltage regulator of claim 2, wherein a first derivative of a current of the current source is maintained below a change threshold while charging the at least one of the plurality of capacitors.

6. The voltage regulator of claim 1, further comprising a charge pump circuit and regulator operative to maintain a bottom plate voltage of the at least one of the plurality of capacitors while the at least one of the plurality of capacitors is disconnected.

7. The voltage regulator of claim 1, wherein the output voltage is connected to a power island of a digital system.

8. A method of operating a voltage regulator, comprising:
generating a switching voltage through controlled closing and opening of a series switch element and a shunt switch element;
generating, by a switchable output filter, a regulated output voltage by filtering the switching voltage, wherein the switchable output filter comprises a plurality of capacitors that are selectively included within the switchable output filter;
disconnecting at least one of the plurality of capacitors upon receiving a first indicator, where disconnecting causes the at least one of the plurality of capacitors to electrically float, wherein while the at least one capacitor is disconnected the output voltage is changed from a first value to a second value;
returning the output voltage to at least one of the first value or a third value upon receiving a second indicator; and
reconnecting the at least one of the plurality of capacitors.

9. The method of claim 8, further comprising charging the at least one of the plurality of capacitors prior to reconnecting the at least one of the plurality of capacitors.

10. The method of claim 8, wherein the at least one of the plurality of capacitors is charged to within a threshold of the output voltage.

11. The method of claim 9, wherein a current of a current source that charges the at least one of the plurality of capacitors is maintained below a maximum current threshold while charging the at least one of the plurality of capacitors.

12. The method of claim 9, wherein a first derivative of a current of a current source that charges the at least one of the plurality of capacitors is maintained below a change threshold while charging the at least one of the plurality of capacitors.

13. The method of claim 8, wherein the output voltage is connected to a power island of a digital system.

14. A digital system voltage supply device, comprising:
a series switch element, and a shunt switch element, wherein a switching voltage is generated through controlled closing and opening of the series switch element and the shunt switch element;
a switched output filter for filtering the switching voltage and generating an output voltage, wherein the switched output filter comprises a plurality of capacitors that are selectively connected and included within the switched output filter;
a digital system including a power island, wherein the output voltage is connected to the power island;
a mode controller, wherein the mode controller is operative to:
disconnect at least one of the plurality of capacitors upon receiving a first indicator, where disconnecting causes the at least one of the plurality of capacitors to electrically float, wherein while the at least one capacitor is disconnected the output voltage is changed from a first value to a second value;
return the output voltage to at least one of the first value or a third value upon receiving a second indicator; and
reconnect the at least one of the plurality of capacitors.

15. A voltage regulator, comprising:
a series switch element, and a shunt switch element, wherein a switching voltage is generated through controlled closing and opening of the series switch element and the shunt switch element;
a switched output filter for filtering the switching voltage and generating an output voltage, wherein the switched output filter comprises a plurality of capacitors that are selectively connected and included within the switched output filter;
a mode controller is operative to:
disconnect at least one of the plurality of capacitors upon receiving a first indicator, where disconnecting causes the at least one of the plurality of capacitors to electrically float,
charge the at least one of the plurality of capacitors from the first value of the output voltage to within a threshold of a second value of the output voltage using a current source, and
reconnect the at least one of the plurality of capacitors.

* * * * *